United States Patent
Matsuno et al.

(10) Patent No.: US 8,331,647 B2
(45) Date of Patent: Dec. 11, 2012

(54) METHOD OF DETERMINING DEFECT SIZE OF PATTERN USED TO EVALUATE DEFECT DETECTION SENSITIVITY AND METHOD OF CREATING SENSITIVITY TABLE

(75) Inventors: Yoshiyuki Matsuno, Shizuoka (JP); Noriaki Musashi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 440 days.

(21) Appl. No.: 12/756,369

(22) Filed: Apr. 8, 2010

(65) Prior Publication Data

US 2010/0266194 A1 Oct. 21, 2010

(30) Foreign Application Priority Data

Apr. 21, 2009 (JP) ................................. 2009-103192

(51) Int. Cl.
*G06K 9/00* (2006.01)
(52) U.S. Cl. ...................................................... 382/144
(58) Field of Classification Search .......... 382/141–149, 382/209, 217, 286, 287, 298; 356/237.1
See application file for complete search history.

(56) References Cited

U.S. PATENT DOCUMENTS

2005/0238221 A1* 10/2005 Hirano et al. ................. 382/144

FOREIGN PATENT DOCUMENTS

JP 2002-296762 10/2002

* cited by examiner

*Primary Examiner* — Tarifur Chowdhury
*Assistant Examiner* — Abdullahi Nur
(74) *Attorney, Agent, or Firm* — Oblon, Spivak, McClelland, Maier & Neustadt, L.L.P.

(57) ABSTRACT

A defect size determining method measures a dimension A2 of a reference pattern 11*s*, a dimension B2 of an adjacent pattern 12*s* formed adjacent the reference pattern 11*s*, a dimension A1 of an evaluation pattern 11, and a dimension B1 of an adjacent pattern 12 formed adjacent the evaluation pattern 11, where the design value of the dimension A1 of the evaluation pattern 11 differs from the design value of the dimension A2 of the reference pattern 11*s* by a predetermined amount. The method then multiplies the measured value of the dimension A1 of the evaluation pattern 11 by the ratio of the measured value of the dimension B2 to the measured value of the dimension B1 and calculates the difference between the resulting value and the measured value of the dimension A2 of the reference pattern 11*s* to determine the defect size of the evaluation pattern 11.

12 Claims, 3 Drawing Sheets

| defect type | A | |
|---|---|---|
| NO. | defect size (A3−A2) | defect detection rate |
| 1 | 2 | 0 |
| 2 | 4 | 0 |
| 3 | 6 | 0 |
| 4 | 8 | 0 |
| 5 | 10 | 20 |
| 6 | 12 | 60 |
| 7 | 14 | 100 |
| 8 | 16 | 100 |

METHOD OF DETERMINING DEFECT SIZE OF PATTERN USED TO EVALUATE DEFECT DETECTION SENSITIVITY AND METHOD OF CREATING SENSITIVITY TABLE

BACKGROUND OF THE INVENTION

1. Field of the Invention

The present invention relates to a method of determining the defect size of an evaluation pattern formed on an evaluation mask and used to evaluate the defect detection sensitivity of a mask defect inspection system, and also relates to a method of creating a sensitivity table.

2. Background Art

In the manufacturing process of semiconductor devices, photomasks and reticles (hereinafter referred to collectively as "masks") are used as original artwork patterns for forming a circuit pattern on a substrate (also referred to as a "wafer"). A mask is typically a transparent glass substrate having a pattern of a light shielding material (e.g., Cr) formed thereon. Charged particle beam writing apparatuses such as electron beam apparatuses, which provide superior resolution, have been used to manufacture such masks.

If a mask has a defect, the image of that defect is transferred to the substrate during the photolithographic printing process, resulting in reduced yield of semiconductor devices. To address this problem, mask defect inspection systems have been used to inspect masks for defects. There are two known mask defect inspection methods: the die-to-die inspection method and the die-to-database method. In the die-to-die inspection method, optical images of two separate identical patterns on a mask are compared to each other. In the die-to-database inspection method, on the other hand, an optical image of a mask is compared to a reference image derived from the writing data (or CAD data) that was used to manufacture the mask.

Evaluation masks (also referred to as programmed defect masks) are used to evaluate the defect detection sensitivity of mask defect inspection systems. One known type of evaluation mask is the sensitivity mask, which has formed thereon a plurality of different-size programmed defects (also referred to as "simulated defects") of each defect type. The sensitivity mask may be inspected for defects a plurality of times by a mask defect inspection system, and the results of the plurality of inspections may be used to create a sensitivity table showing the defect detection rate of the mask defect inspection system for each programmed defect, making it possible to evaluate the defect detection sensitivity of the mask defect inspection system. Further, such a sensitivity table may be created periodically to manage the state of the mask defect inspection system.

The recent trend toward finer circuit patterns requires accurate control of the critical dimension (CD) of patterns. To achieve this, a mask defect inspection system is used to inspect the patterns on the mask to find ones whose critical dimension deviates from its design value by a large amount. Such defective patterns are said to be CD defects (or dimensional defects). Japanese Laid-Open Patent Publication No. 2002-296762 discloses a method of detecting a CD defect. In order to evaluate the CD defect detection sensitivity of mask defect inspection systems, each sensitivity mask has formed thereon a plurality of programmed CD defects (serving as evaluation patterns) whose CDs differ from the design value of the CD of the reference pattern (or desired pattern) by different amounts.

In order to accurately evaluate the defect detection sensitivity of a mask defect inspection system, it is necessary to accurately determine the defect size of each evaluation pattern included in the sensitivity mask used. According to a conventional defect size determining method, the sensitivity mask has formed thereon a reference pattern which has a reference critical dimension (or design dimension). With this arrangement, the dimension of the reference pattern and the corresponding dimension (i.e., critical dimension) of each evaluation pattern described above are measured, and the difference between the two measured values is regarded as the defect size of the evaluation pattern.

The above reference pattern and evaluation patterns are formed on the sensitivity mask through processes such as writing by an electron beam writing apparatus, developing, and etching. Generally, the reference pattern and the evaluation patterns on the sensitivity mask are spaced from each other. It should be noted that two supposedly identical patterns (i.e., patterns whose dimensions have the same design value) formed on the sensitivity mask may be slightly different in dimension from each other if they are not at the same location, because of the difference between their writing positions and because of process variations. This means that the defect size of an evaluation pattern determined by the conventional defect size determining method as described above includes, in addition to the "true" defect size (or designed defect size), dimensional variation due to the difference between the writing positions of the evaluation pattern and the reference pattern and due to process variations. This prevents accurate determination of the defect size of evaluation patterns, making it impossible to accurately evaluate the defect detection sensitivity of the mask defect inspection system.

The present invention has been made in view of the above problems. It is, therefore, an object of the present invention to provide a defect size determining method of defect detection sensitivity evaluation patterns, capable of accurately determining the defect size of an evaluation pattern on an evaluation mask used to evaluate the defect detection sensitivity of mask defect inspection systems.

SUMMARY OF THE INVENTION

In accordance with a first aspect of the present invention, to achieve the foregoing object, there is provided a method of determining a defect size of an evaluation pattern used to evaluate defect detection sensitivity, which measures a dimension of a reference pattern and the corresponding dimension of the evaluation pattern and calculates the difference between the measured value of the dimension of the reference pattern and the measured value of the dimension of the evaluation pattern to determine the defect size of the evaluation pattern, wherein the reference pattern and the evaluation pattern are formed on an evaluation mask used to evaluate the defect detection sensitivity of a mask defect inspection system, and wherein the design value of the dimension of the evaluation pattern differs from the design value of the dimension of the reference pattern by a predetermined amount, the method comprising: measuring the dimension of the reference pattern, the dimension of the evaluation pattern, the corresponding dimension of a first adjacent pattern, and the corresponding dimension of a second adjacent pattern, wherein the first adjacent pattern is formed adjacent to and in a predetermined positional relationship with the reference pattern, wherein the second adjacent pattern is formed adjacent the evaluation pattern so that the second adjacent pattern is in the same positional relationship with respect to the evaluation pattern as is the first adjacent pattern with respect to the reference pattern, and wherein the design value of the dimension of the second adjacent pattern is the same as that of the dimension of the first adjacent pattern; calculating the ratio of the measured value of the dimension of the first adjacent pattern to the measured value of the dimension of the second adjacent pattern; and multiplying the measured value of the dimension of the evaluation pattern by the ratio and calculating the difference between the resulting value and the measured value of the dimension of the reference pattern to determine the defect size of the evaluation pattern. It should be noted that the term "same positional relationship" as used in the present specification and claims is intended to cover, in addition to exactly same positional relationships, substantially same positional relationships and slightly different positional relationships.

In accordance with a second aspect of the present invention, there is provided a method of creating a sensitivity table showing the defect detection rate of a mask defect inspection system for an evaluation pattern whose design dimension differs from a reference dimension by a predetermined amount and which is formed on an evaluation mask used to evaluate the defect detection sensitivity of the mask defect inspection system, the method inspecting the evaluation pattern for defects a plurality of times using the mask defect inspection system and creating the sensitivity table based on the results of the plurality of inspections and based on the defect size of the evaluation pattern determined by the defect size determining method of defect detection sensitivity evaluation patterns in accordance with the above first aspect.

DETAILED DESCRIPTION OF THE EMBODIMENTS

Embodiments of the present invention will be described in detail.

Embodiment 1

Figure 1:
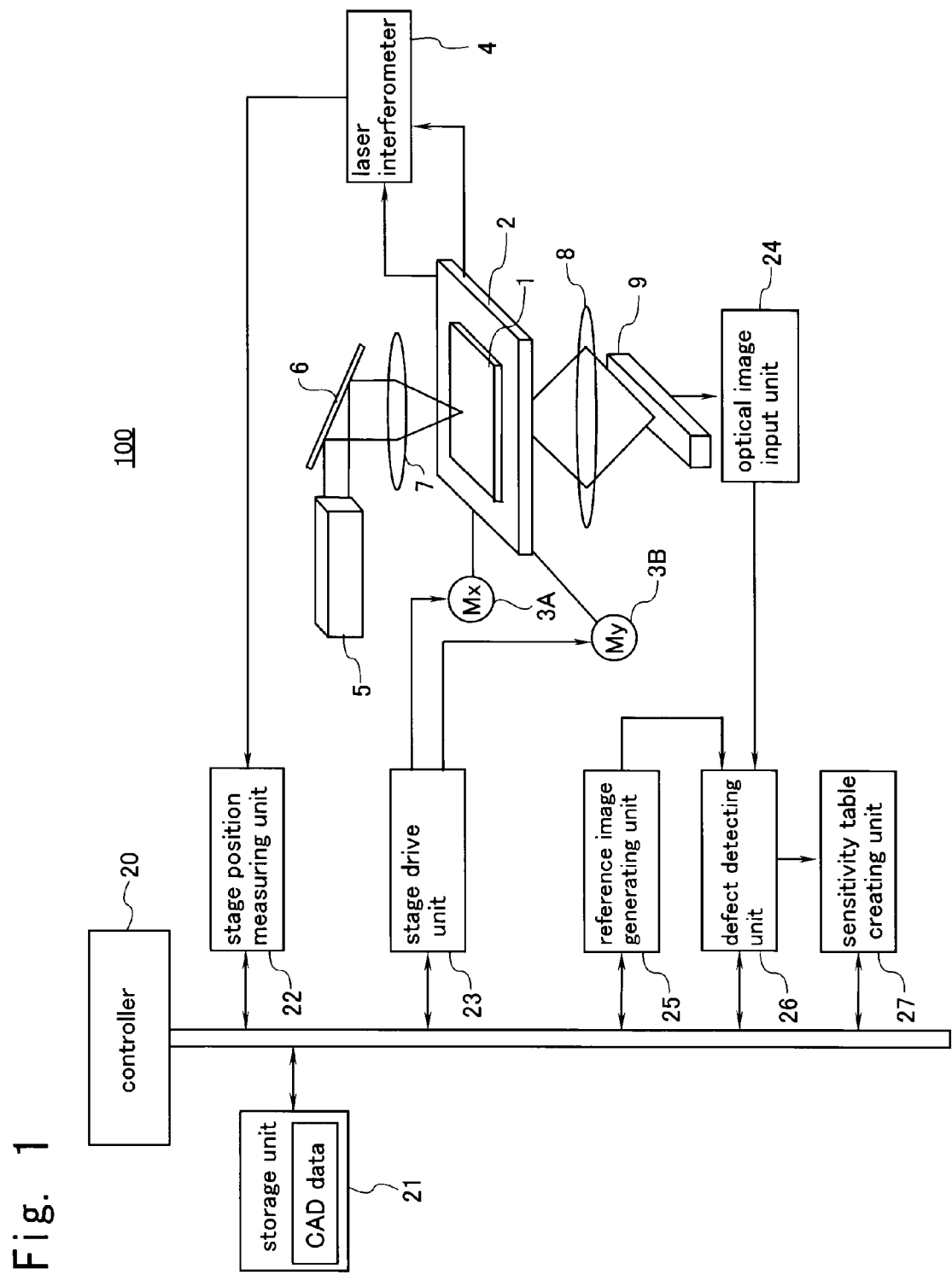
FIG. 1 is a schematic diagram showing the configuration of a mask defect inspection system according to a first embodiment of the present invention.

FIG. 1 is a schematic diagram showing the configuration of a mask defect inspection system according to a first embodiment of the present invention.

Referring to FIG. 1, a mask defect inspection system 100 includes a stage 2 for holding thereon a mask 1 to be inspected. The stage 2 can be moved in the X and Y directions by a X-direction motor 3A and a Y-direction motor 3B. These motors 3A and 3B are driven by a stage drive unit 23. The X and Y positions of the stage 2 are measured by a stage position measuring unit 22 using a laser interferometer 4.

The mask inspection system 100 also includes a light source 5 for emitting laser light. The laser light emitted from the light source 5 is directed to the surface of the mask 1 by a mirror 6 and a lens 7. The light transmitted through the mask 1 passes through and is focused by an imaging lens 8 to form an image on an image sensor 9. The image sensor 9 may be a line sensor (one-dimensional) or a two-dimensional CCD sensor (TDI sensor). The optical image produced by the image sensor 9 is temporarily stored in an optical image input unit 24 and is then output to a defect detecting unit 26.

The mask inspection system 100 has the controller 20 which executes overall control. Also the mask defect inspection system 100 includes a reference image generating unit 25 for generating a reference image used as a comparison reference for the optical image. The reference image generating unit 25 expands CAD data (i.e., mask design data) stored in a storage unit 21 and performs resizing, corner-rounding, and filtering processing on the expanded data to produce a reference image which is output to the defect detecting unit 26. The defect detecting unit 26 compares the optical image received from the optical image input unit 24 with the reference image received from the reference image generating unit 25, and if these images of patterns are not identical, determines the inspected pattern to be a defective pattern (or pattern defect). The inspection results from the defect detecting unit 26 are stored in the storage unit 21.

Sensitivity masks, which have formed thereon a plurality of evaluation patterns (or programmed CD defects) whose critical dimensions differ from the design value of the critical dimension of the reference pattern (or desired pattern) by different amounts, are used to evaluate the defect detection sensitivity of the mask defect inspection system 100. A sensitivity table creating unit 27 creates a sensitivity table (see FIG. 3, described later) based on the results of a plurality of inspections of the same sensitivity mask. As described above, the defect size of an evaluation pattern measured by a conventional defect size determining method includes, in addition to the "true" defect size (or designed defect size), dimensional variation of the evaluation pattern due to the difference between the wiring positions of the evaluation pattern and the reference pattern and due to process variations, and this defect size is listed in the sensitivity table. The following describes an exemplary defect size determining method of evaluation patterns.

Figures 2, 3:
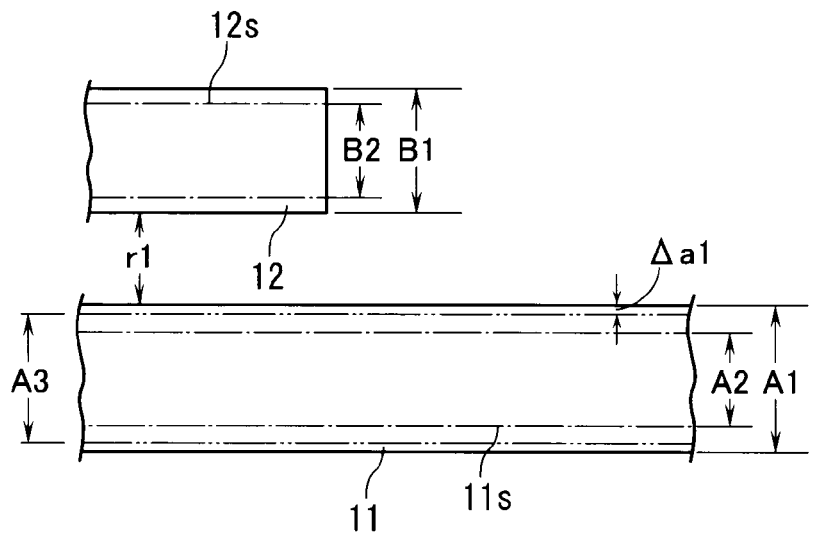
FIG. 2 is a diagram illustrating a method of determining a defect size of an evaluation pattern according to a first embodiment of the present invention.
FIG. 3 is a diagram illustrating a sensitivity table created by using a defect size of a first embodiment of the present invention.

FIG. 2 is a diagram illustrating a method of determining the defect size of an evaluation pattern 11 formed on a sensitivity mask.

In order to simplify the explanation that follows, the evaluation pattern 11 and a reference pattern 11s are shown in FIG. 2 as if they overlapped each other. In reality, however, these patterns are located at different places on the sensitivity mask. The reference pattern 11s is formed, or written, on the sensitivity mask so that the reference pattern 11s has a reference critical dimension (or design dimension); the reference pattern 11s is used as a reference to determine the defect size of the evaluation pattern 11. The design dimension, or the design value of the dimension of the reference pattern 11s, may be, e.g., 400 nm. The evaluation pattern 11 is formed, or written, on the sensitivity mask is such that the design value of the dimension (or critical dimension) of the evaluation pattern 11 differs from the design value of the dimension of the reference pattern 11s by a predetermined amount. An adjacent pattern 12 is formed at a distance r1 from the evaluation pattern 11.

Another adjacent pattern 12s is formed adjacent the reference pattern 11s so that the positional relationship between the reference pattern 11s and the adjacent pattern 12s is the same as that between the evaluation pattern 11 and the adjacent pattern 12. It will be noted that although in FIG. 2 the adjacent patterns 12 and 12s are shown as if they overlapped each other, these patterns are formed at different places on the sensitivity mask.

Although the dimension (or critical dimension) B1 of the adjacent pattern 12 and the dimension (or critical dimension) B2 of the adjacent pattern 12s have the same design value, their actual values are different from each other, as shown in FIG. 2. This difference between the dimensions B1 and B2 results from the difference between the writing positions of the adjacent patterns 12 and 12s and from process variations. It should be noted that in FIG. 2 the difference between the dimensions B1 and B2 is shown exaggeratedly for a better understanding of the explanation. Actually, the difference between the dimensions B1 and B2 is, e.g., approximately a few nanometers. According to the first embodiment, the values of the dimensions B1 and B2 of the adjacent patterns 12 and 12s are used when accurately determining the defect size of the evaluation pattern 11.

The defect size determining method of the first embodiment begins by measuring the dimension A1 of the evaluation pattern 11, the dimension B1 of the adjacent pattern 12, the dimension A2 of the reference pattern 11s, and the dimension B2 of the adjacent pattern 12s. The values of these dimensions A1, B1, A2, and B2 may be determined from CD-SEM (or critical dimension SEM) images. That is, the value of the dimension A1 of the evaluation pattern 11 and the value of the dimension B1 of the adjacent pattern 12 can be determined from images of these patterns taken by CD-SEM. Likewise, the value of the dimension A2 of the reference pattern 11s and the value of the dimension B2 of the adjacent pattern 12s can be determined from images of these patterns taken by CD-SEM.

Since as described above the dimensions B1 and B2 of the adjacent patterns 12 and 12s, respectively, have the same design value, the difference between the measured values of these dimensions, i.e., the dimensional variation between the adjacent patterns 12 and 12s, results from the difference between the writing positions of these patterns and from process variations. The method of the first embodiment then calculates the ratio of the measured value of the dimension B2 of the adjacent pattern 12s to the measured value of the dimension B1 of the adjacent pattern 12 (i.e., B2/B1). The measured value of the dimension A1 of the evaluation pattern 11 is then multiplied by this ratio, and the measured value of the dimension A2 of the reference pattern 11s is subtracted from the resulting value, as represented by the expression (1) below. The subtraction result gives the "true" defect size of the evaluation pattern 11.

$$\text{Defect size} = A1 \times (B2/B1) - A2 \qquad (1)$$

Let A3 denote the value resulting from multiplying the measured value of the dimension A1 of the evaluation pattern 11 by the ratio of the measured value of the dimension B2 of the adjacent pattern 12s to the measured value of the dimension B1 of the adjacent pattern 12. This value A3 gives the value of the dimension A1 of the evaluation pattern 11 after compensating for, or removing, the dimensional variation $\Delta a1$ of the evaluation pattern 11 due to the difference between the writing positions of the evaluation pattern 11 and the reference pattern 11s and due to process variations. Therefore, the "true" defect size of the evaluation pattern 11 can be obtained by subtracting the measured value of the dimension A2 of the reference pattern 11s from the value A3 (i.e., A3−A2).

It should be noted that although in FIG. 2 the defect size (A3−A2) and the dimensional variation $\Delta a1$ are shown delimited by lines, this is merely for purposes of illustration. The defect size determining method of the first embodiment determines the defect size of the evaluation pattern 11 after compensating for, or removing, the dimensional variation $\Delta a1$ of the evaluation pattern 11 due to the difference between the writing positions of the evaluation pattern 11 and the reference pattern 11s and due to process variations, that is, the method can accurately determine the defect size of the evaluation pattern 11.

A sensitivity table creating method of the first embodiment will now be described.

This method begins by inspecting the same sensitivity mask for defects a plurality of times using the mask defect inspection system 100. The results of the plurality of inspections and the defect sizes of the evaluation patterns determined as described above are used to create a sensitivity table as shown in FIG. 3. The sensitivity table shown in FIG. 3 lists the defect detection rate of the mask defect inspection system for each of different-size programmed CD defects #1 to #8 of defect type A, which means that the CD of each defect (or evaluation pattern) is greater than the design value of the CD of the reference pattern.

In practice, each sensitivity table lists the defect detection rate of a mask defect inspection system for each of a plurality of different-size programmed defects of each of a plurality of defect types in addition to defect type A. As described above, the measured value of the dimension A2 of the reference pattern 11s is subtracted from the value A3 of the dimension A1 of the evaluation pattern 11 after compensating for, or removing, the dimensional variation $\Delta a1$ of the evaluation pattern 11 due to the difference between the writing positions of the evaluation pattern 11 and the reference pattern 11s and due to process variations (i.e., A3−A2) to determine the "true" defect size of the evaluation pattern 11. Each defect size listed in sensitivity tables is also determined in the same manner. In this way the sensitivity table creating unit 27 in the mask defect inspection system 100 can create a sensitivity table that allows accurate evaluation of the defect detection sensitivity of the system.

Embodiment 2

Figure 4:
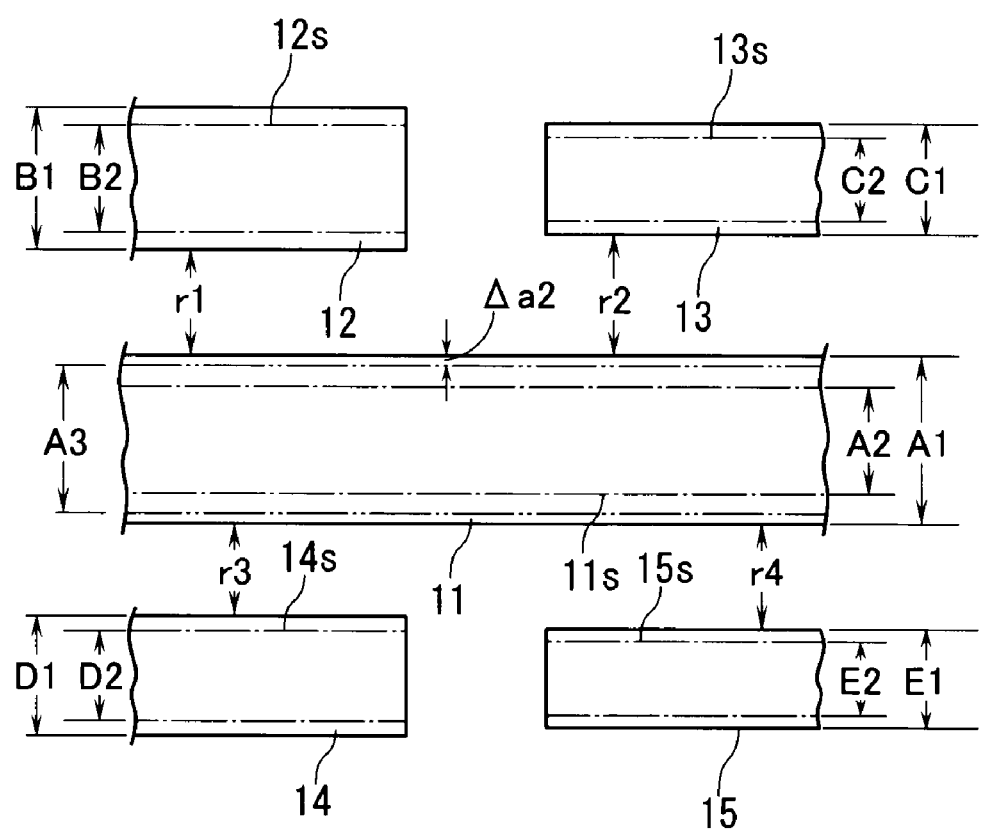
FIG. 4 is a diagram illustrating a method of determining a defect size of an evaluation pattern according to a second embodiment of the present invention.

FIG. 4 is a diagram illustrating a method of determining the defect size of an evaluation pattern according to a second embodiment of the present invention.

In the first embodiment described above, one pattern, namely the adjacent pattern 12, is formed adjacent the evaluation pattern 11, and another pattern, namely the adjacent pattern 12s, is formed adjacent the reference pattern 11s. In the second embodiment, on the other hand, four adjacent patterns 12 to 15 are formed adjacent the evaluation pattern 11, and four adjacent patterns 12s to 15s are formed adjacent the reference pattern 11s, as shown in FIG. 4.

As shown in FIG. 4, the adjacent pattern 13 is formed at the same side of the evaluation pattern 11 as the adjacent pattern 12 and spaced a distance r2 from the evaluation pattern 11. The adjacent patterns 14 and 15 are formed on the opposite side of the evaluation pattern 11 and face the adjacent patterns 12 and 13, respectively. The adjacent patterns 14 and 15 are spaced distances r3 and r4, respectively, from the evaluation pattern 11. Although in the example shown in FIG. 4 the adjacent patterns 12 to 15 have different dimensions, it is to be understood that they may have the same dimension.

The adjacent patterns 12s to 15s are formed on the sensitivity mask so that the positional relationships between the reference pattern 11s and the adjacent patterns 12s to 15s are the same as those between the evaluation pattern 11 and the adjacent patterns 12 to 15, respectively. Although in FIG. 4, as in FIG. 2, the evaluation pattern 11 and the reference pattern 11s are shown as if they overlapped each other, in reality these patterns are located at different places on the sensitivity mask.

Further, the adjacent patterns 12 to 15 and the adjacent patterns 12s to 15s are also formed at different places.

Although the dimensions (or critical dimensions) B1 to E1 of the adjacent patterns 12 to 15 and the dimensions (or critical dimensions) B2 to E2 of the adjacent patterns 12s to 15s have the same design values, respectively, their actual values are different from each other, as shown in FIG. 4. These differences between the dimensions B1 to E1 and dimensions B2 to E2, respectively, result from the differences between the writing positions of the adjacent patterns and from process variations.

The defect size determining method of the second embodiment begins by measuring the dimension A1 of the evaluation pattern 11, the dimensions B1 to E1 of the adjacent patterns 12 to 15, the dimension A2 of the reference pattern 11s, and the dimensions B2 to E2 of the adjacent patterns 12s to 15s. The values of these dimensions A1, B1 to E1, A2, and B2 to E2 may be determined from CD-SEM images, as in the first embodiment.

The method then calculates the average of the measured values of the dimensions B1 to E1 of the adjacent patterns 12 to 15 adjacent the evaluation pattern 11 and also calculates the average of the measured values of the dimensions B2 to E2 of the adjacent patterns 12s to 15s adjacent the reference pattern 11s. The ratio of the average of the measured values of the dimensions B2 to E2 to the average of the measured values of the dimensions B1 to E1 is then calculated. The measured value of the dimension A1 of the evaluation pattern 11 is then multiplied by this ratio, and the measured value of the dimension A2 of the reference pattern 11s is subtracted from the resulting value, as represented by the expression (2) below. The subtraction result gives the "true" defect size of the evaluation pattern 11.

$$\text{Defect size} = A1 \times \{(B2+C2+D2+E2)/4\}/\{B1+C1+D1+E1\}/4\} - A2 \qquad (2)$$

Let A3 denote the value resulting from multiplying the measured value of the dimension A1 by the ratio of the average of the measured values of the dimensions of the adjacent patterns 12s to 15s to that of the measured values of the dimensions of the adjacent patterns 12 to 15. This value A3 gives the value of the dimension A1 of the evaluation pattern 11 after compensating for, or removing, the dimensional variation Δa2 of the evaluation pattern 11 due to the difference between the writing positions of the evaluation pattern 11 and the reference pattern 11s and due to process variations. Therefore, the "true" defect size of the evaluation pattern 11 can be obtained by subtracting the measured value of the dimension A2 of the reference pattern 11s from the value A3 (i.e., A3−A2). Thus, the defect size determining method of the second embodiment determines the defect size of the evaluation pattern 11 after compensating for, or removing, the dimensional variation Δa2 of the pattern due to the difference between the writing positions of the evaluation pattern 11 and the reference pattern 11s and due to process variations, that is, the method can accurately determine the defect size of the evaluation pattern 11.

Further, according to the second embodiment, the average of the measured values of the dimensions B1 to E1 of the adjacent patterns 12 to 15 and the average of the measured values of the dimensions B2 to E2 of the adjacent patterns 12s to 15s are calculated, and then the ratio of the latter average to the former average is calculated. Therefore, the defect size of the evaluation pattern 11 can be accurately determined even if the dimensions B1 to E1 are different from one another.

It will be understood that the present invention is not limited to the embodiments described above since various alterations may be made thereto without departing from the spirit and scope of the invention.

For example, although in the second embodiment four adjacent patterns are formed on the sensitivity mask, it is to be understood that in other embodiments of the invention any number of adjacent patterns may be formed on the mask.

The features and advantages of the present invention may be summarized as follows.

The method of the first aspect of the present invention can accurately determine the defect size of an evaluation pattern formed on an evaluation mask used to evaluate the defect detection sensitivity of a mask defect inspection system.

The method of the second aspect of the present invention can create a sensitivity table that enables accurate evaluation of the defect detection sensitivity of a mask defect inspection system.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-103192, filed on Apr. 21, 2009 including specification, claims, drawings and summary, on which the Convention priority of the present application is based, are incorporated herein by reference in its entirety.

What is claimed is:

1. A method of determining a defect size of an evaluation pattern used to evaluate defect detection sensitivity, which measures a dimension of a reference pattern and the corresponding dimension of said evaluation pattern and calculates the difference between the measured value of said dimension of said reference pattern and the measured value of said dimension of said evaluation pattern to determine said defect size of said evaluation pattern, wherein said reference pattern and said evaluation pattern are formed on an evaluation mask used to evaluate the defect detection sensitivity of a mask defect inspection system, and wherein the design value of said dimension of said evaluation pattern differs from the design value of said dimension of said reference pattern by a predetermined amount, said method comprising:

measuring said dimension of said reference pattern, said dimension of said evaluation pattern, the corresponding dimension of a first adjacent pattern, and the corresponding dimension of a second adjacent pattern, wherein said first adjacent pattern is formed adjacent to and in a predetermined positional relationship with said reference pattern, wherein said second adjacent pattern is formed adjacent said evaluation pattern so that said second adjacent pattern is in the same positional relationship with respect to said evaluation pattern as is said first adjacent pattern with respect to said reference pattern, and wherein the design value of said dimension of said second adjacent pattern is the same as that of said dimension of said first adjacent pattern;

calculating the ratio of the measured value of said dimension of said first adjacent pattern to the measured value of said dimension of said second adjacent pattern; and multiplying the measured value of said dimension of said evaluation pattern by said ratio and calculating the difference between the resulting value and the measured value of said dimension of said reference pattern to determine said defect size of said evaluation pattern.

2. The method according to claim 1, further comprising imaging said reference pattern and said first adjacent pattern to produce a first image and further imaging said evaluation pattern and said second adjacent pattern to produce a second image, wherein said dimension measuring step includes measuring said dimension of said reference pattern and said dimension of said first adjacent pattern as appearing in said first image and further includes measuring said dimension of said evaluation pattern and said dimension of said second adjacent pattern as appearing in said second image.

3. The method according to claim 1, wherein:

a plurality of said first adjacent patterns are formed adjacent said reference pattern, and a plurality of said second adjacent patterns are formed adjacent said evaluation pattern;

said dimension measuring step includes measuring said dimension of each of said plurality of first adjacent patterns and said dimension of each of said plurality of second adjacent patterns; and said ratio calculating step includes calculating an average of the measured values of said dimensions of said plurality of first adjacent patterns and an average of the measured values of said dimensions of said plurality of second adjacent patterns and calculating the ratio of said average of said measured values of said dimensions of said plurality of first adjacent patterns to said average of said measured values of said dimensions of said plurality of second adjacent patterns.

4. The method according to claim 3, further comprising imaging said reference pattern and said plurality of first adjacent patterns to produce a first image and further imaging said evaluation pattern and said plurality of second adjacent patterns to produce a second image, wherein said dimension measuring step includes measuring said dimension of said reference pattern and said dimensions of said plurality of first adjacent patterns as appearing in said first image and further includes measuring said dimension of said evaluation pattern and said dimensions of said plurality of second adjacent patterns as appearing in said second image.

5. The method according to claim 3, wherein the design values of said dimensions of said plurality of first adjacent patterns differ from one another, and the design values of said dimensions of said plurality of second adjacent patterns differ from one another.

6. The method according to claim 5, further comprising imaging said reference pattern and said plurality of first adjacent patterns to produce a first image and further imaging said evaluation pattern and said plurality of second adjacent patterns to produce a second image, wherein said dimension measuring step includes measuring said dimension of said reference pattern and said dimensions of said plurality of first adjacent patterns as appearing in said first image and further includes measuring said dimension of said evaluation pattern and said dimensions of said plurality of second adjacent patterns as appearing in said second image.

7. A method of creating a sensitivity table showing the defect detection rate of a mask defect inspection system for an evaluation pattern, which method inspects said evaluation pattern for defects a plurality of times using said mask defect inspection system and creates said sensitivity table based on the results of said plurality of inspections and based on the defect size of said evaluation pattern determined by a defect size determining method of defect detection sensitivity evaluation patterns, wherein said defect size determining method measures a dimension of a reference pattern and the corresponding dimension of said evaluation pattern and calculates the difference between the measured value of said dimension of said reference pattern and the measured value of said dimension of said evaluation pattern to determine said defect size of said evaluation pattern, wherein said evaluation pattern and said reference pattern are formed on an evaluation mask used to evaluate the defect detection sensitivity of said mask defect inspection system, and wherein the design value of said evaluation pattern differs from the design value of said reference pattern by a predetermined amount, said defect size determining method comprising:

measuring said dimension of said reference pattern, said dimension of said evaluation pattern, the corresponding dimension of a first adjacent pattern, and the corresponding dimension of a second adjacent pattern, wherein said first adjacent pattern is formed adjacent to and in a predetermined relationship with said reference pattern, wherein said second adjacent pattern is formed adjacent said evaluation pattern so that said second adjacent pattern is in the same positional relationship with respect to said evaluation pattern as is said first adjacent pattern with respect to said reference pattern, and wherein the design value of said dimension of said second adjacent pattern is the same as that of said dimension of said first adjacent pattern;

calculating the ratio of the measured value of said dimension of said first adjacent pattern to the measured value of said dimension of said second adjacent pattern; and multiplying the measured value of said dimension of said evaluation pattern by said ratio and calculating the difference between the resulting value and the measured value of said dimension of said reference pattern to determine said defect size of said evaluation pattern.

8. The sensitivity table creating method according to claim 7, wherein:

said defect size determining method further comprises imaging said reference pattern and said first adjacent pattern to produce a first image and further imaging said evaluation pattern and said second adjacent pattern to produce a second image; and said dimension measuring step includes measuring said dimension of said reference pattern and said dimension of said first adjacent pattern as appearing in said first image and further includes measuring said dimension of said evaluation pattern and said dimension of said second adjacent pattern as appearing in said second image.

9. The sensitivity table creating method according to claim 7, wherein:

a plurality of said first adjacent patterns are formed adjacent said reference pattern, and a plurality of said second adjacent patterns are formed adjacent said evaluation pattern;

said dimension measuring step includes measuring said dimension of each of said plurality of first adjacent patterns and said dimension of each of said plurality of second adjacent patterns; and said ratio calculating step includes calculating an average of the measured values of said dimensions of said plurality of first adjacent patterns and an average of the measured values of said dimensions of said plurality of second adjacent patterns and calculating the ratio of said average of said measured values of said dimensions of said plurality of first adjacent patterns to said average of said measured values of said dimensions of said plurality of second adjacent patterns.

10. The sensitivity table creating method according to claim 9, wherein:

said defect size determining method further comprises imaging said reference pattern and said plurality of first adjacent patterns to produce a first image and further imaging said evaluation pattern and said plurality of second adjacent patterns to produce a second image; and said dimension measuring step includes measuring said dimension of said reference pattern and said dimensions of said plurality of first adjacent patterns as appearing in said first image and further includes measuring said dimension of said evaluation pattern and said dimensions of said plurality of second adjacent patterns as appearing in said second image.

11. The sensitivity table creating method according to claim 9, wherein the design values of said dimensions of said plurality of first adjacent patterns differ from one another, and the design values of said dimensions of said plurality of second adjacent patterns differ from one another.

12. The sensitivity table creating method according to claim 11, wherein:

said defect size determining method further comprises imaging said reference pattern and said plurality of first adjacent patterns to produce a first image and further imaging said evaluation pattern and said plurality of second adjacent patterns to produce a second image; and said dimension measuring step includes measuring said dimension of said reference pattern and said dimensions of said plurality of first adjacent patterns as appearing in said first image and further includes measuring said dimension of said evaluation pattern and said dimensions of said plurality of second adjacent patterns as appearing in said second image.

* * * * *